United States Patent [19]
Wassink

[11] Patent Number: 5,633,940
[45] Date of Patent: May 27, 1997

[54] AUDIO AMPLIFIER ARRANGEMENT

[75] Inventor: Derk J. C. Wassink, Eindhoven, Netherlands

[73] Assignee: U.S. Philips Corporation, New York, N.Y.

[21] Appl. No.: 639,810

[22] Filed: Apr. 29, 1996

Related U.S. Application Data

[63] Continuation of Ser. No. 213,774, Mar. 16, 1994, abandoned.

[30] Foreign Application Priority Data

Mar. 19, 1993 [EP] European Pat. Off. ............ 93200806

[51] Int. Cl.$^6$ ........................... H03G 3/00; H03G 9/00
[52] U.S. Cl. ............... 381/107; 381/55; 381/102; 381/108
[58] Field of Search ........................ 330/278, 279, 330/280; 381/102, 103, 106, 108

[56] References Cited

U.S. PATENT DOCUMENTS

| | | | |
|---|---|---|---|
| 5,255,324 | 10/1993 | Brewer et al. | 381/107 |
| 5,271,063 | 12/1993 | d'Alayer de Costemore d'Arc | 381/107 |
| 5,303,371 | 4/1994 | Nakajima | 381/109 |

FOREIGN PATENT DOCUMENTS 0403069  12/1990  European Pat. Off. .

OTHER PUBLICATIONS

Laboratory note A–106, "Digital controlled stereo audioprocessor TDA730X manual", SGS–Thomson; Nov. 1989.

*Primary Examiner*—Curtis Kuntz
*Assistant Examiner*—Xu Mei
*Attorney, Agent, or Firm*—Laurie E. Gathman

[57] ABSTRACT

The disclosed audio amplifier arrangement includes a first amplifier stage for influencing the signal strength of the received audio signal for at least part of the frequency spectrum of an audio signal received through an input. An output amplifier stage amplifies the signal influenced by the first amplifier stage. A detection present in the output amplifier stage detects overloads of the output amplifier stage (3). A control circuit causes, in response to the detection signal, an adjustment to be made of the influence caused by the first amplifier stage if the overload signalled by the detection signal transgresses a certain limit. This limit depends on the magnitude of the adjustment already carried out, so that the degree of overload corresponding to the limit increases when the extent of the adjustment increases.

7 Claims, 3 Drawing Sheets

AUDIO AMPLIFIER ARRANGEMENT

This is a continuation of application Ser. No. 08/213,774 filed Mar. 16, 1994, now abandoned.

BACKGROUND OF THE INVENTION

The invention relates to an audio amplifier arrangement having an audio signal input for receiving an audio signal, comprising a first amplifier stage for influencing the signal strength of the received audio signal for at least part of the frequency spectrum of the audio signal, an output amplifier stage for amplifying the signal influenced by the first amplifier stage, the output amplifier stage comprising detection means for detecting an overload of the output amplifier stage, and the audio amplifier arrangement comprising a control means for adjusting the influence of the first amplifier stage on the received audio signal in response to a signal from the detection means in the case where the degree of overload indicated by the signal from the detection means exceeds a limit laid down by a certain limit criterion in order to reduce the signal strength of the influenced audio signal.

An arrangement of said type is known, for example, from Laboratory note A-106 "Digital controlled stereo audioprocessor TDA730X manual" SGS-THOMSON; November 1989. In prior-art arrangement the output amplifier stage produces a detection pulse with each overload. In reaction to each detection pulse the adjustment (reduction) of the gain factor of the first amplifier stage is enhanced by a step of 2 dB. In this manner there is avoided the distortion which occurs on reproduction of the sound represented by the audio signal. If for a certain period of time thereafter no detection pulses are produced any longer, the adjustment is cancelled in steps.

The arrangement has the drawback that in the case where the user sets the volume to such a high level that the control means intervene by reducing the gain factor, a change of the volume setting by the user has hardly perceivable consequences. To the listener it seems as if the arrangement does not react to a change of the volume setting.

SUMMARY OF THE INVENTION

It is an object of the invention to provide an arrangement in which the overload of the output amplifier stage is largely reduced, but in which a change of the volume setting by the user does have a clearly perceivable effect.

According to the invention, this object is achieved in an arrangement as defined in the opening paragraph which is further characterized in that the limit laid down by the limit criterion depends on the adjustment already realised by the control means, so that the degree of overload corresponding to the limit increases when the adjustment increases.

As the limit laid down by the limit criterion depends on the adjustment in the arrangement according to the invention, the adjustment finally realised in response to the detected overload will depend on the volume setting made by the user. Worded differently, the degree of suppression of overload depends on the volume set by the user. This means that with a high volume level set by the user overloads of the output amplifier stage are largely suppressed, it is true, but are more distinctly audible than for lower volume levels set by the user. Thus when the user increases the volume setting, he notices a slight increase of the output volume without this leading to unacceptable distortion of the audio information.

An embodiment of the invention attractive for its simple realizability is characterized in that the control means comprise means for increasing the adjustment in steps after an uninterrupted series of a specific number of overloads has been detected in which series the time intervals between the successive overloads do not exceed a first length of time, means for reducing the adjustment in the case where the detection means have not detected any overload within a time interval having a second length of time, while said number of overloads to be detected for an increase of the adjustment increases with the extent of the adjustment already carried out.

Another embodiment of the arrangement according to the invention is characterized in that the adjustment realised by the control means is an adjustment of the bass setting or a reduction of a volume setting, in which the control means comprise selection means for selecting according to a specific selection criterion and in response to the instantaneous adjustment, a reduction of the bass setting and/or reduction of the volume setting to modify the adjustment of the setting.

This embodiment is also based on the understanding that a reduction of overload of the output amplifier stage can be realised by reducing the signal strength over the entire frequency spectrum of the signal to be amplified and also by reducing the lower frequencies in the frequency spectrum. For that matter, the signal components of these low frequencies relatively strongly add to the signal power. This embodiment makes it possible to realise the reduction of overload in a fashion in which the bass setting and/or volume setting is reduced according to a specific selection criterion.

A further embodiment is characterized in that the control means comprise a memory for storing a series of first and second codes, the selection means selecting a code in this series having a position that depends on the instantaneous setting and making a selection determined by the selected code.

This embodiment makes it possible to modify in a simple manner the data for the criterion used for the selection. This is especially important because the desired selection criterion is generally determined on the basis of subjective grounds and may thus show significant differences between one customer and the next. In the arrangement according to the invention the selection criterion may be simply adjusted to fulfil the client's wishes.

BRIEF DESCRIPTION OF THE DRAWING

The invention will be further explained hereinafter with reference to the drawing FIGS. 1 to 4, in which.

DETAILED DESCRIPTION OF THE PREFERRED

Figure 1:
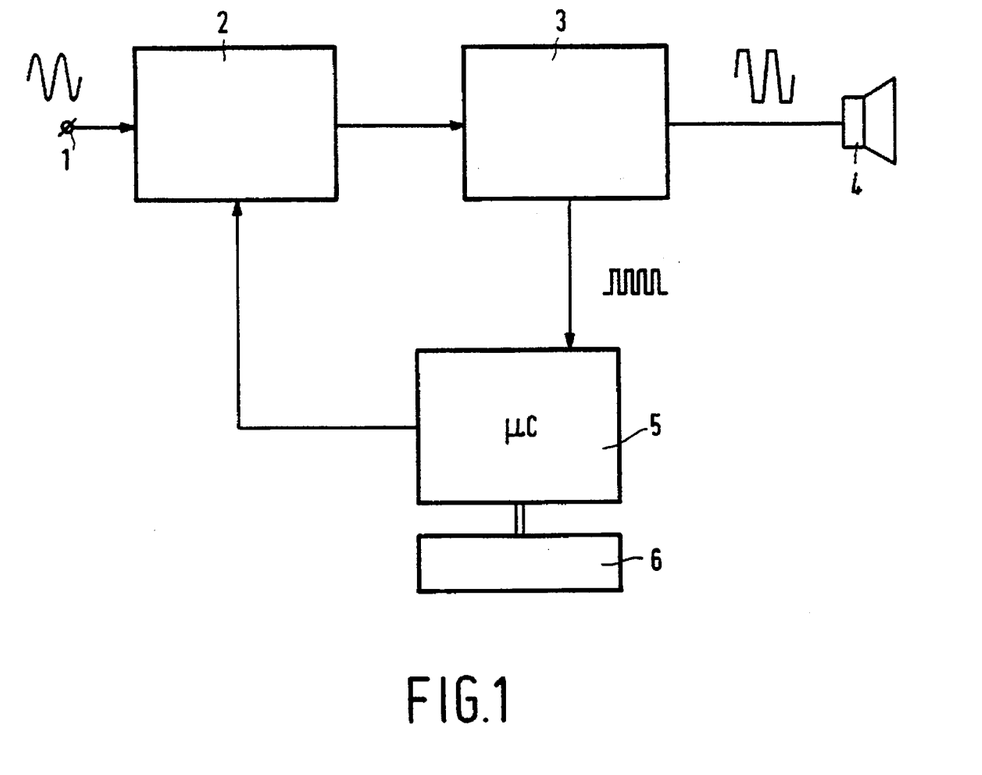
FIG. 1 shows an embodiment of the arrangement according to the invention.

FIG. 1 shows an audio amplifier arrangement. Reference character 1 is used to denote an input for receiving an audio signal. The audio signal received on input 1 is applied to an amplifier stage 2 for the signal strength of the received audio signal to be influenced for at least part of the frequency spectrum of the input signal. Such an amplifier stage 2 may comprise an integrated circuit of the type TDA6330T. Such an integrated circuit has a transfer characteristic which can be modified by adjusting three parameters. These parameters are the volume setting by which the gain factor for the whole frequency range can be adjusted in steps of a certain number of dBs, the "bass" setting by which the gain factor for the bass can be relatively increased or reduced in the audio signal frequency spectrum in steps of a certain number of dBs, and a treble setting by which the gain factor for treble in the audio signal frequency spectrum can be relatively increased or reduced in steps of a certain number of dBs. The (amplified) audio signal influenced by the amplifier stage 2 is applied to an output amplifier stage 3. An audio output of the output amplifier stage 3 is coupled to an electroacoustic converter 4 of a customary type for reproduction of the audio information. The output amplifier stage is one of a type producing a detection signal if the amplifier stage 3 is overloaded. This is to say that the output amplifier stage is driven to the end of its signal excursion range. Such an output amplifier stage may comprise, for example, an integrated circuit of the type TDA1555Q.

Figure 2:
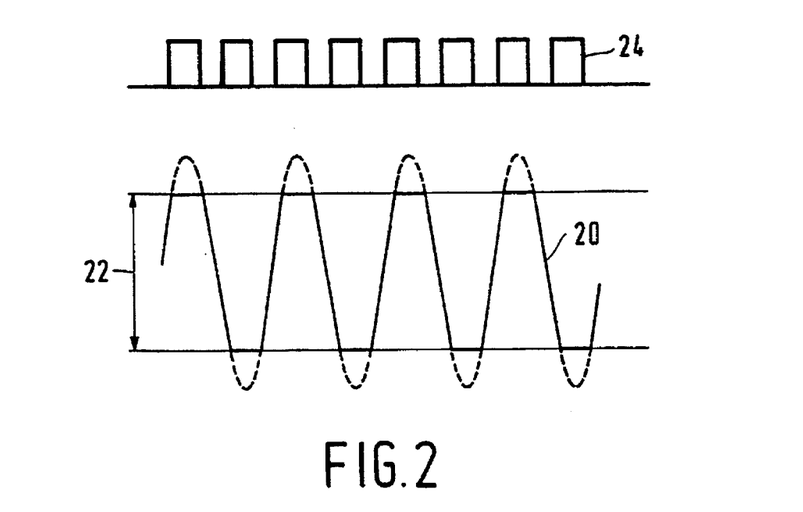
FIG. 2 shows a plurality of signals plotted against time as they may occur in the arrangement shown in FIG. 1, and FIGS. 3 and 4 show adjustments of the influence on the audio signal as they may occur in an arrangement according to the invention.

By way of illustration FIG. 2 represents the distorted output signal of the output amplifier stage 3 if a sinusoidal signal having a signal strength causing overload to occur is applied to the output amplifier stage 3. The signal affected by overload is referenced 20. The output range of the output amplifier stage is referenced 22. The difference between the signal 20 distorted by overload and a corresponding undistorted signal is shown in dashed lines. The detection signal produced in the event of overload is referenced 24. The detection signal is constituted by detection pulses indicating each a time interval in which the overload occurs. The duty cycle of the detection pulse i.e. the ratio of the pulse width to the duration of the time interval of the pulse is an indication of the extent to which overload occurs. The larger this duty cycle is, the more overload there is.

The amplifier arrangement further includes a control circuit 5, for example, of a program controlled type, which is coupled to the amplifier stage 2, for example, by a so-termed I2C bus, for setting the volume, bass and treble in accordance with control commands which can be fed by a user via a control panel 6.

The detection signal produced by the output amplifier stage 3 is also applied to the control circuit 5. The control circuit 5 contains a program for adjusting, in response to the detection signal, the volume setting and/or the bass setting and/or the treble setting to reduce the signal strength of the audio signal amplified by the amplifier stage 2.

In the arrangement according to the invention the reaction to the overloads the adjustment is changed in response to the overload shown by the detection signal if the extent of overload exceeds a threshold that depends on the magnitude of the adjustments already made, in such a way that the extent of overload corresponding to the threshold increases when the adjustment increases.

The manner in which this may be effected will be explained in detail hereinafter with reference to the drawing FIGS. 3 and 4.

Figure 3:
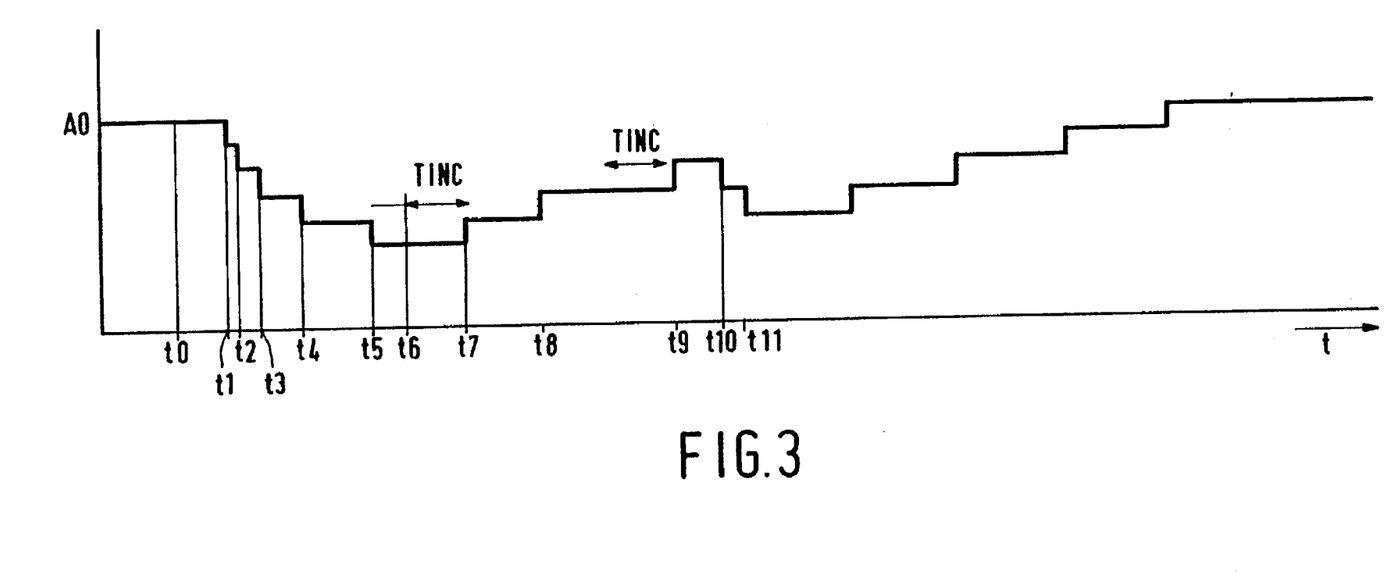

FIG. 3 shows plotted against time t the volume setting caused by the control circuit in the case where there is overload in the output amplifier stage. A0 is used to denote the volume level set by the user. At instant t0 there has been no overload for a rather long period of time and the volume level set by the control circuit is equal to A0. At instant t1 the detection signal denotes that there is overload in the output amplifier stage which overload exceeds a limit determined by a specific limit criterion. According to this criterion, in the case where the volume level is set to the level desired by the user, that is to say, there has been no adjustment yet, the set volume is to be adjusted as early as when there is a slight overload, for example, immediately after a detection pulse has been generated. As a result, the control circuit 5 adjusts the set volume in a step of, for example, 2 dB. In consequence, the amplitude of the signal supplied by the first amplifier stage 2 to the output amplifier stage 3 will diminish. To reduce the volume in a further step, a higher degree of overload is necessary than for the adjustment of the volume setting in the previous step. Worded differently, an ever higher degree of overload is necessary for further steps.

A possible criterion for establishing whether the volume setting is to be reduced in a further step, may be, for example, a detection criterion according to which a detection is made whether the duty cycle exceeds a threshold value that depends on the number of steps in which the volume has already been adjusted.

In the situation represented in FIG. 3 the reduction of the signal strength effected at instant t1 is insufficient to avoid further overload. At instant t2 there is established on the basis of the detection signal that there is still overload which is higher than the limit laid down by the criterion for the case where the volume has already been adjusted in an adjustment step. As observed hereinbefore, the duty cycle of the detection pulse can be used to establish the degree of overload. A parameter for establishing the degree of overload and which is attractive for its reliability is the number of successive detection pulses produced at intervals shorter than a limit value apart. This number of detection pulses can be counted as follows. If no detection pulse is generated during a time interval exceeding said limit value, the count is set to zero. Subsequently, the count is incremented after each detection pulse following a previous detection pulse in the time interval determined by the limit value. Once the number of pulses counted in this fashion exceeds a threshold value, the volume is reduced by a step. This threshold value depends on the number of steps by which the volume setting has already been reduced. The Table below shows the threshold value Ns as a function of the number of steps S by which the volume has already been reduced.

| S | Ns |
| --- | --- |
| 0 | 1 |
| 1 | 200 |
| 2 | 500 |
| 3 | 1000 |
| 4 | 4000 |
| 5 | 7000 |
| 6 | 10000 |
| >6 | 15000 |

There should be observed that the Table shown above is only one of the many possible relations between the threshold value Ns and the number of steps S already carried out. It is only essential that the threshold value increase with an increasing number of steps S that have already been carried out. However, it is not necessary that the threshold value increase with each next step. This threshold value may be the same for a limited number of successive steps.

In FIG. 3 the instants t1, . . . , t5 denote the instants at which the threshold value determined by the number of steps already carried out is exceeded.

After instant t6, no overload is detected any longer for a time interval TINC in length. At an instant t7 at the end of an interval TINC without overload, the volume is increased again by a step. For the same reasons, the volume is increased each time by a step at the instants t8 and t9. Subsequently, at instants t10 and t11 the counted number of overloads again exceeds the threshold value and the volume is reduced in steps. After the instant t11 a period of time begins in which a transgression of the threshold value is no longer detected. As a result, the volume is incremented in steps until the level A0 desired by the user is reached again. The volume is maintained at this setting until a next transgression of the threshold value is detected. According to the method described hereinbefore, the overload is reduced by adjusting only the volume setting.

Figure 4:
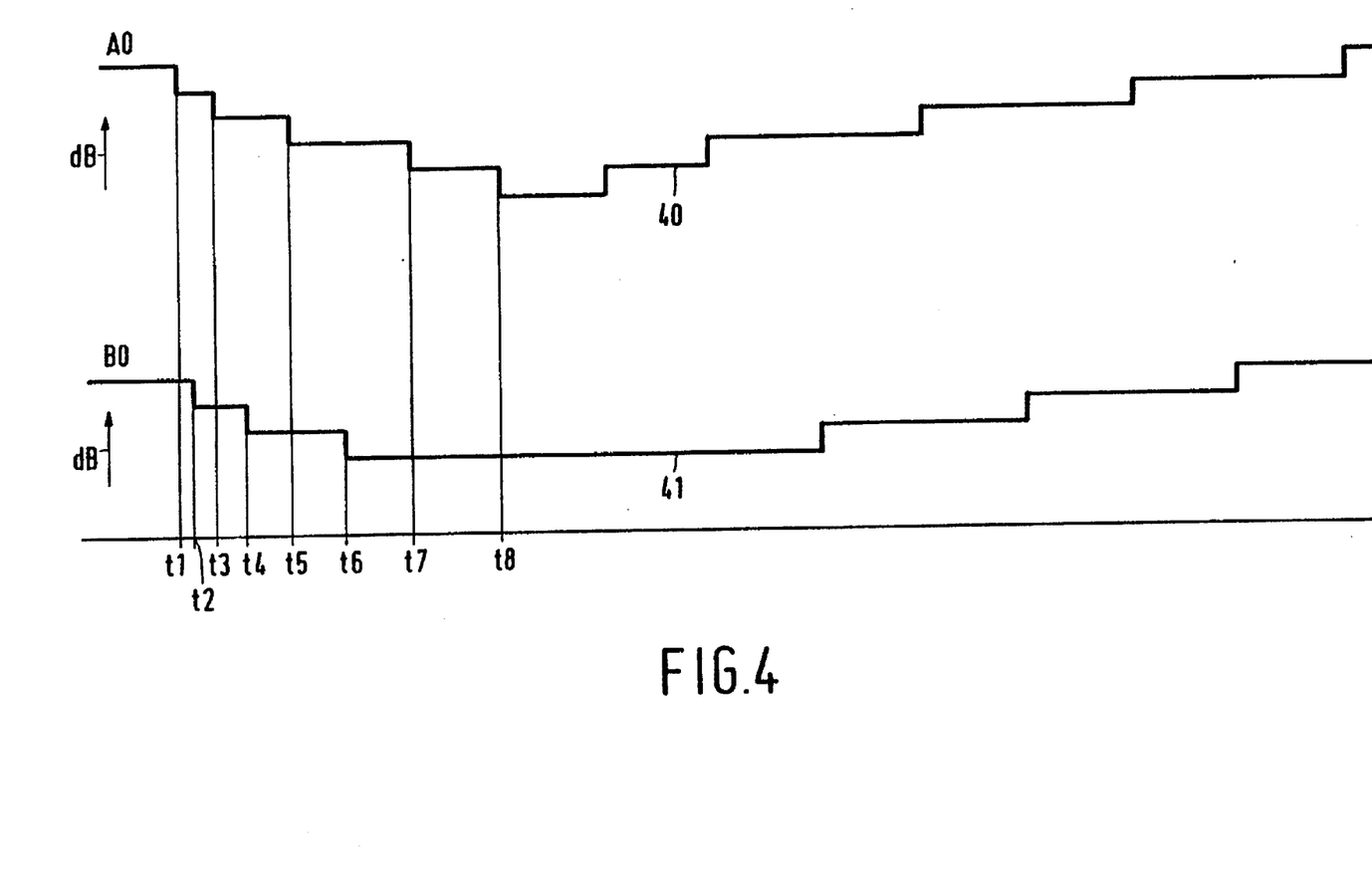

With reference to FIG. 4 a method will be described hereinafter in which a reduction of the overload is obtained by adjustment of both the volume setting and the bass setting. FIG. 4 shows plotted against time t the curves 40 and 41 as the volume setting and bass setting respectively. The level of the volume set by the user is again referenced A0. The level of the bass setting desired by the user is denoted B0. When the threshold values are exceeded, the volume setting or the bass setting is adjusted in dependence on the number of adjustments already made. The criterion belonging to drawing FIG. 4 on the basis of which a selection is made whether the next adjustment is to be an adjustment of the volume setting or an adjustment of the bass setting is laid down in the Table below. In this Table column S shows the number of adjustments already made. Symbol X in columns V and B denotes that an adjustment of the volume setting and bass setting respectively, is to be made.

| S  | V | B |
|----|---|---|
| 0  | X |   |
| 1  |   | X |
| 2  | X |   |
| 3  |   | X |
| 4  | X |   |
| 5  |   | X |
| 6  | X |   |
| >6 | X |   |

According to this Table the volume setting and the bass setting are initially adjusted alternately. After five adjustments only adjustments of the volume setting are carried out.

There should be observed that for the selection criterion on the basis of which there is a selection whether the next adjustment is to be an adjustment of the volume setting or an adjustment of the bass setting, other criteria can be applied than a selection criterion according to which the selection is determined by the number of steps already made. For example, it is possible to have this selection depend on the levels set by the user. For example, in the case where the user has set the bass setting to a high level, first the bass setting can be reduced and then the volume setting, whereas in the event of a bass setting at a low or medium level, the bass setting can be left as it is and only the volume setting can be adjusted. It will be evident to a person skilled in the art that there are numerous other criteria possible for choosing between an adjustment of the bass setting and an adjustment of the volume setting. Alternatively, it is possible to reduce the overload by adjusting the treble setting. In that case a selection can be made from volume, bass or treble setting.

In FIG. 4 the instants at which the volume setting is reduced by a step are referenced t1, t3, t5, t7 and t8. The instants at which the bass setting is reduced are referenced t2, t4 and t6.

After the instant t8 transgressions of the threshold value are no longer detected and each time after a time interval TINC has elapsed, in which no overload has been detected, the volume setting or bass setting can be increased in a reverse order to the order in which the settings have been reduced.

In the embodiment explained with reference to the drawing FIG. 4, the threshold value for deciding whether a further adjustment is desired or not depends on the adjustment already made. In addition, according to a specific selection criterion there is decided whether the adjustment can also be made in embodiments in which said threshold value does not depend on the adjustment already made.

Control circuit 5 contains a suitable control program for making an adjustment of the volume setting and bass setting as described hereinbefore. A possible embodiment for the program is laid down in the following program Table in the form of a program description in the PASCAL programming language.

In the program a number of variables are defined which will be briefly discussed.

— The variable "PulsesRequired" denotes the number of detection pulses to be counted (threshold value) before a subsequent adjustment of the volume setting or bass setting is to take place.

— The variable "PulsesCounted" denotes the number of detection pulses counted.

— The variable "LowTime" denotes the minimum period of time that has to be elapsed after a reduction of the volume setting or bass setting before the volume setting or bass setting may be increased again.

— The variable "IncrTime" denotes the length of the time interval in which no detection pulse must occur prior to an increase of the volume or bass setting.

— The variable "dVol" denotes the total adjustment of the volume setting relative to the volume set by the user.

— The variable "dBass" denotes the total adjustment of the bass setting relative to the bass setting set by the user.

— The variable "ControlStep" denotes the sum of the number of steps in which the volume setting and bass setting have already been adjusted.

— The variable "ControlString" denotes a character string formed by the characters "b" and "v". The character at the position denoted by the variable "ControlStep" denotes whether the adjustment to be made relates to an adjustment of the volume setting or an adjustment of the bass setting. An adjustment of the volume setting is denoted by the character "v" and the adjustment of the bass setting is denoted by the character "b".

The program further comprises the following functions.

— The function of "ClippingPulse" responds, after a call, with a logic value (boolean). This logic value denotes whether a detection pulse is applied to the control circuit 5.

— The function of "KeyPressed" responds, after a call, with a logic value denoting whether a key of the control panel 6 has been depressed. This function is of no further interest for understanding the program.

— The function of "TimerReady" responds, after a call, with a logic value denoting whether the timer specified in the call has finished its operation.

The program further includes the following procedures:

— The "Initialize" procedure sets the initial values of the variables.

— The "StartTimer" procedure starts, after a call, a timer specified in the call. In addition, the call states the period of time after which the timer is to finish its operation.

— The "WaitForEndOfPulse" procedure waits, after a call, for the generated detection pulse to be over. This to avoid the program responding more than once to the same detection pulse.

— The "DeltaVolume" procedure sets, after a call, the volume to a value equal to the volume set by the user reduced by the adjustment given in the call of the procedure.

— The "DeltaBass" procedure sets, after a call, the bass setting to a value equal to the bass setting set by the user, reduced by the adjustment given in the call of the procedure.

— The "SetPulsesRequired" procedure sets, after a call, the variable "PulsesRequired" to the value determined by the variable "ControlStep".

— The "HandleAudioDeltas" procedure calculates the variable "dVol" and variable "dBass" on the basis of the "ControlString" and the variable "ControlStep". Furthermore, the "DeltaVolume" and "DeltaBass" procedures are called in this "HandleAudioDeltas" procedure to set the volume and bass settings in accordance with the calculated values of "dVol" and "dBass". In addition, the value of the variable "PulsesRequired" is adjusted in this procedure by the calling of the "SetPulsesRequired" procedure.

— The "DecreaseAudio" procedure increases the value of the variable "ControlStep" by 1. Then the "HandleAudioDeltas" procedure is called to adjust the volume setting or bass setting in accordance with the new value of "ControlStep". Before the "DecreaseAudio" 6procedure is finished, the timer is started and set to stop after the time interval denoted "LowTime" has elapsed.

— The "IncreaseAudio" procedure first checks whether the variable "ControlStep" exceeds zero. If it does not, this means that the bass setting and volume setting correspond to the levels set by the user. In that case the procedure is finished again. If the variable "ControlStep" exceeds zero, the "ControlStep" variable is decreased by 1 and then the procedure "HandleAudioDeltas" is called to adjust the bass setting and volume setting in accordance with the new value of "ControlStep". Subsequently, the "StartTimer" procedure is called to start the timer and set the timer to stop after a time interval has elapsed determined by the variable "IncrTime". Once the timer has started, the procedure is finished.

— The "HandleKeyInput" procedure handles the key input from the keys. This procedure is of little importance for understanding the program.

— The "HandleClippingPulse" procedure increases, after a call, the number of pulses counted denoted by the variable "PulsesCounted". In addition, during this procedure there is checked whether the value thus obtained of "PulsesCounted" exceeds the threshold value denoted by the variable "PulsesRequired". If it does, the volume or bass setting is adjusted by calling the "DecreaseAudio" procedure. In addition, the variable "PulsesCounted" is set to zero. Before the "HandleClippingPulse" procedure is finished, the "WaitForEndOfPulse" procedure is called, so that finishing the "HandleClippingPulse" procedure is postponed until the detection pulse has ended.

— The "HandleNoClippingPulse" procedure checks, after a call, on the basis of the variable "ControlStep" whether the volume setting and bass setting correspond to the values set by the user. If not, a check is made on the basis of the function value of "TimerReady" whether the timer has stopped. If it has, the "IncreaseAudio" procedure is called, so that the volume setting or bass setting is reduced by a step.

The main program is shown in the last part of the program description. When the main program is carried out, first the "Initialize" procedure is called. The calling of this procedure is followed by a "REPEAT" statement. When this statement is carried out, a program loop is repeated infinitely. In this program loop first a check is made on the basis of the function value of the "ClippingPulse" function or "KeyPressed" function whether a detection pulse has been received or whether a key has been depressed. If not, the "HandleNoClippingPulse" procedure is called. Once the "HandleNoClippingPulse" procedure has been finished, the program is continued with the execution of the program loop in the main program. If the presence of a detection pulse is detected on the basis of the function of "ClippingPulse", the "HandleClippingPulse" procedure is called. Thereafter, the beginning of the program loop is resumed.

The execution of the program is as follows. After the "Initialize" procedure has been carried out, the program loop of the main program is continuously run through. As long as no detection pulse is produced by the output amplifier stage, the "HandleNoClippingPulse" is constantly called. As no adjustment of the bass and volume setting has taken place at the start of the program, the "HandleNoClippingPulse" procedure will be finished forthwith without further action being taken.

Once a detection pulse has been produced by the output amplifier stage, the "HandleClippingPulse" procedure is called in the program loop of the main program. In this procedure the "PulsesCounted" variable is first increased by 1 and then a check is made whether the thus adjusted value of this variable is greater than or equal to the value of the "PulsesRequired". If not, the procedure is finished again once the "WaitForEndOfPulse" procedure has been carried out. If so, the variable "PulsesCounted" is reset to zero and the "DecreaseAudio" procedure is called. While this procedure is being carried out, the "ControlStep" variable is adjusted and the "HandleAudioDeltas" procedure is called. In this procedure the values of the "dVol" and "Dbass" variables which represent the adjustment of the volume setting and of the bass setting are calculated on the basis of the variable "ControlStep" and the variable "ControlString". Then, by calling the "DeltaVolume" and "DeltaBass" procedures, the bass and volume settings are carried out in accordance with the values of the variables "dVol" and "dBass". Subsequently, by calling the "SetPulsesRequired" procedure the value belonging to the variable "ControlStep" is assigned to the variable "PulsesRequired" which variable determines the threshold value of the number of detection pulses up to the next adjustment. Thereafter the program returns to the "DecreaseAudio" procedure in which the timer is started and the program returns to the "HandleClippingPulse" procedure. Once this procedure has been returned to, the end of the detection pulse is waited for by calling the "WaitForEndOfPulse" procedure to return subsequently to the program loop of the main program. After the return to the program loop of the main program, there is again established again on the basis of the function value of the function of "ClippingPulse" whether the "HandleClippingPulse" procedure or the "HandleNoClippingPulse" procedure is to be called. If the "HandleNoClippingPulse" procedure is called, a check is made, provided that the volume setting and the bass setting have not yet returned to the level set by the user, whether the timer has stopped. If it has not, the "HandleNoClippingPulse" procedure is finished again. If it has, the "IncreaseAudio" procedure is called. In this procedure the variable "ControlStep" is decreased. Then the "HandleAudioDeltas" procedure is called in which the values "dVol" and "dBass" belonging to the new value of "ControlStep" are determined and after which the volume and bass settings are carried out in accordance with this new value. Once the program has finished the "HandleAudioDeltas" procedure, the timer is started and the program returns to the "HandleNoClippingPulse" procedure. This procedure is immediately finished to return to the program loop of the main program.

With the program described hereinbefore, each time when the number of detection pulses counted (denoted by "PulsesCounted") exceed the threshold value (indicated by "PulsesRequired") determined by the adjustment already made (indicated by "ControlStep"), this threshold value is constantly adjusted further. Whether the adjustment is an adjustment of the volume setting or of the bass setting is denoted by the ("v" or "b") character in "ControlString" at the position in this string planned for "ControlStep". The timer is restarted after each detection pulse. If, subsequently, when the "HandleNoClippingPulse" procedure is carried out, there is detected that the timer has stopped, the adjustment of the bass setting or of the volume setting is reduced. This process of reduction of the adjustment is continued until the bass setting and the volume setting have again reached the level set by the user.

```
Const
        SofacTimer      = 1;
        On              = True;
        Off             = False;
        ForEver         = False;
    ControlString1 =    'vvvvvvvvvvvvvvvvvvvvvvvvvvvvvvvvvvvvvvvvvvvvvv';
    ControlString2 =    'vvbvbvvvvvvvvvvvvvvvvvvvvvvvvvvvvvvvvvvvvvvvvv';
    ControlString3 =    'vbvbvbvvvvvvvvvvvvvvvvvvvvvvvvvvvvvvvvvvvvvvvv';
    ControlString4 =    'bbbbvvvvvvvvvvvvvvvvvvvvvvvvvvvvvvvvvvvvvvvvvv';
Var
    PulsesRequired,
    PulsesCounted       :   Integer;
    LowTime,
    IncrTime            :   LongInt;
    dVol,
    dBass,
    ControlStep         :   Integer;
    ControlString       :   String;
Procedure Initialize;
Begin
    PulsesRequired      : = 1;
    PulsesCounted       : = 0;
    LowTime             : = 2000;
    IncrTime            : = 2000;
    ControlString       : = ControlString1;
    ControlStep         : = 0;
    dVol                : = 0;
    dBass               : = 0;
End; {Initialize}
Function KeyPressed: Boolean;
Begin
        (*Pascal routine*)
End; {KeyPressed}
Procedure StartTimer (TimerNr:Byte;Value:Integer);
Begin
End; {StartTimer}
Function TimerReady (TimerNr:Byte): Boolean;
Begin
        (*This function returns True if TimerNr is ready*)
End; {TimerReady}
Function ClippingPulse:Boolean;
Begin
        (*This function returns True if the Clipping I/O pin of the μc is high.*)
End; {ClippingPulse}
    Procedure WaitForEndOfPulse;
    Begin
        (*This Procedure waits until the Clipping I/O pin of the μc is low, to prevent
an additional reaction on the same pulse*)
End; (WaitForEndOfPulse)
Procedure DeltaVolume (DeltaV:Integer);
Begin
        (*Change Sofac Volume values with DeltaV*)
End; {DeltaVol}
Procedure DeltaBase (DeltaB:Integer);
Begin
        (*Change Sofac Bass value with DeltaB*)
End; {DeltaBass}
Procedure SetPulsesRequired;
Begin
    Case ControlStep of
        1..2        : PulsesRequired : = 1;
        3..4        : PulsesRequired : = 200;
        5           : PulsesRequired : = 500;
        6           : PulsesRequired : = 1000;
        7           : PulsesRequired : = 4000;
```

```
        8..12    : PulsesRequired : = 7000;
        13..30   : PulsesRequired : = 10000;
    End; (Case)
End; (SetPulsesRequired)
Procedure HandleAudioDeltas;
Var Indx    : Integer;
Begin
    dVol: = 0; dBass: = 0;
    Indx: = 1;
    While Indx <= ControlStep do
    begin
        Case UpCase (ControlString[Indx]) of
        'V': Inc(dVol,2); {1 SOFAC step}
        'B': Inc(dBass,3); {1 SOFAC step}
        end; (Case)
        Inc(Indx);
    end; {While}
    DeltaVolume(dVol);
    DeltaBass(dBass);
    SetPulsesRequired;
End; {HandleAudioDeltas}
Procedure DecreaseAudio;
Begin
    Inc(ControlStep,1);
    HandleAudioDeltas;
    StartTimer(SofacTimer,LowTime);
End; {DecreaseAudio}
Procedure IncreaseAudio;
Begin
    If ControlStep > 0 then
    begin
        Dec(ControlStep,1);
        HandleAudioDeltas;
        StartTimer(SofacTimer,IncrTime);
    end;
End; {IncreaseAudio}
Procedure HandleKeyInput;
Begin
    (*This procedure handles the keyboard inputs*)
End; {HandleKeyInput}
Procedure HandleClippingPulse;
Begin
    Inc(PulsesCounted);
    If PulsesCounted >= PulsesRequired then
    begin
        PulsesCounted: = 0;
        DecreaseAudio;
    end;
    WaitForEndOfPulse;
End; {HandleClippingPulse}
Procedure HandleNoClippingPulse;
Begin
    If ControlStep > 0 then
        If TimerReady(SofacTimer) then IncreasAudio;
End; {HandleNoClippingPulse}
Begin {DCC}
    Initialize;
    Repeat
        If ClippingPulse or Keypressed then
        begin
            If KeyPressed
                then HandleKeyInput
                else HandleClippingPulse;
        end
        else HandleNoClippingPulse;
    Until ForEver;
End.
```

I claim:

1. An audio amplifier arrangement, comprising:

an input for receiving an audio signal;

a first amplifier stage for raising and lowering the signal strength of the received audio signal for at least a portion of the frequency spectrum of the audio signal;

an output amplifier stage for amplifying the signal from the first amplifier stage and wherein the output amplifier stage is overloaded when the signal from the first amplifier stage exceeds a particular limit by a predetermined amount;

detection means for detecting that the output amplifier stage is overloaded and for providing an overload detection signal; and control means for causing the first amplifier stage to lower the strength of the received audio signal in response to the overload detection signal and for causing the predetermined amount to be increased by a particular degree upon the lowering of the signal strength of the received audio signal, such that the detection signal will only be generated a next time if the signal from the first amplifier stage exceeds the particular limit by the increased predetermined amount.

2. The audio amplifier arrangement as claimed in claim 1, characterized in that the control means comprise means for increasing the adjustment in steps after an uninterrupted series of a specific number of overloads has been detected in which series the time intervals between the successive overloads do not exceed a first length of time, means for reducing the adjustment in the case where the detection means has not detected any overload within a time interval having a second length of time, while said number of overloads to be detected for an increase of the adjustment increases with the extent of the adjustment already carried out.

3. The audio amplifier arrangement as claimed in claim 1, characterized in that the adjustment realised by the control means is an adjustment of the bass setting or a reduction of a volume setting, in which the control means comprise selection means for selecting according to a specific selection criterion and in response to the instantaneous adjustment, a reduction of the bass setting and/or reduction of the volume setting to modify the adjustment of the setting.

4. The audio amplifier arrangement as claimed in claim 1, characterized in that the control means comprise a memory for storing a series of first and second codes, the selection means selecting a code in this series having a position that depends on the instantaneous setting and making a selection determined by the selected code.

5. An audio amplifier as claimed in claim 1, wherein if the particular limit is set at P and the predetermined amount is set at N and the signal from the first amplifier stage exceeds P by N the control means will cause the first amplifier stage to reduce the signal strength of the received audio signal and increase the predetermined amount to N plus some value X such that the control means will only cause the amplifier stage to reduce the signal strength a next time when the detection means detects that the signal from the first amplifier stage exceeds P by N plus X.

6. An audio amplifier as claimed in claim 5, wherein the control means includes means for causing the first amplifier stage to reduce the signal strength in steps for each uninterrupted series of a specified number of overloads which has been detected in which series the time intervals between the successive overloads do not exceed a first length of time, the control means further including means for causing the first amplifier stage to increase the signal strength when the detection means has not detected any overload within a time interval having a second length of time.

7. An audio amplifier arrangement, comprising:

an input for receiving an audio signal;

a first amplifier stage for raising and lowering the signal strength of the received audio signal for at least a portion of the frequency spectrum of the audio signal;

an output amplifier stage for amplifying the signal from the first amplifier stage, and wherein the output amplifier stage is in overload when the signal from the first amplifier stage exceeds a particular limit by a predetermined amount;

detection means for detecting that the output amplifier stage is in overload and for providing an overload detection signal;

a user operated signal controller including at least one of i) a volume control, and ii) a bass control, for causing the first amplifier stage to raise and lower the signal strength of the relevant portion of the received audio signal in response to a user adjusting the user operated signal controller; and control means for causing the first amplifier stage to lower the signal strength of the received audio signal in response to the overload detection signal, and for causing the predetermined amount to be increased by a particular degree upon the lowering of the signal strength such that if a user adjusts the volume or bass control to increase the signal strength of the received audio signal an increase in signal strength will be detected by the user even though the overload occurred.

* * * * *